US011570921B2

(12) United States Patent
Liu et al.

(10) Patent No.: US 11,570,921 B2
(45) Date of Patent: Jan. 31, 2023

(54) SEMICONDUCTOR DEVICE WITH STACKED TERMINALS

(71) Applicant: Tesla, Inc., Austin, TX (US)

(72) Inventors: Wenjun Liu, Santa Clara, CA (US); Robert James Ramm, Mountain View, CA (US); Colin Campbell, San Francisco, CA (US)

(73) Assignee: Tesla, Inc., Austin, TX (US)

( * ) Notice: Subject to any disclaimer, the term of this patent is extended or adjusted under 35 U.S.C. 154(b) by 432 days.

(21) Appl. No.: 14/737,086

(22) Filed: Jun. 11, 2015

(65) Prior Publication Data
US 2016/0366778 A1 Dec. 15, 2016

(51) Int. Cl.
*H05K 7/02* (2006.01)
*H01L 23/051* (2006.01)
*H01L 23/538* (2006.01)
*B23K 26/32* (2014.01)
*B23K 33/00* (2006.01)
*B23K 26/244* (2014.01)
*B23K 26/22* (2006.01)
*H01L 23/02* (2006.01)
*H01L 23/492* (2006.01)
(Continued)

(52) U.S. Cl.
CPC ............... *H05K 7/02* (2013.01); *B23K 26/22* (2013.01); *B23K 26/244* (2015.10); *B23K 26/32* (2013.01); *B23K 33/00* (2013.01); *H01L 23/02* (2013.01); *H01L 23/051* (2013.01); *H01L 23/492* (2013.01); *H01L 23/5385* (2013.01); *H01L 25/072* (2013.01); *B23K 2101/04* (2018.08); *B23K 2101/24* (2018.08); *H01L 23/3735* (2013.01); *H01L 23/5383* (2013.01); *H01L 2224/33* (2013.01)

(58) Field of Classification Search
CPC .......... H01L 23/02; H01L 23/051; H05K 7/02
See application file for complete search history.

(56) References Cited

U.S. PATENT DOCUMENTS 5,548,133 A 8/1996 Kinzer
6,191,456 B1 2/2001 Stoisiek et al.
(Continued)

FOREIGN PATENT DOCUMENTS

CN 101820106 9/2010
CN 102881682 1/2013
(Continued)

OTHER PUBLICATIONS

The latest advances in industrial IGBT module technology, Eric R. Motto and John F. Donlon, IEEE, 2004, 6 pages.
(Continued)

*Primary Examiner* — Rockshana D Chowdhury
*Assistant Examiner* — Douglas R Burtner
(74) *Attorney, Agent, or Firm* — Knobbe, Martens, Olson & Bear, LLP

(57) ABSTRACT

A semiconductor device includes: a housing; a substrate inside the housing; first and second semiconductor circuits on the substrate; and first and second planar terminals electrically connected to the first and second semiconductor circuits, respectively, the first and second planar terminals stacked on top of each other, wherein each of the first and second planar terminals extends away from the housing.

20 Claims, 3 Drawing Sheets

(51) Int. Cl.
  *H01L 25/07* (2006.01)
  *H01L 23/373* (2006.01)
  *B23K 101/24* (2006.01)
  *B23K 101/04* (2006.01)

(56) References Cited

U.S. PATENT DOCUMENTS

| | | | |
|---|---|---|---|
| 6,211,567 | B1 | 4/2001 | Pelly |
| 6,255,672 | B1* | 7/2001 | Yoshioka ............ H01L 25/072 |
| | | | 257/107 |
| 6,674,164 | B1 | 1/2004 | Rippel et al. |
| 9,036,388 | B2 | 5/2015 | Komatsu |
| 9,164,342 | B2* | 10/2015 | Moriwaki ............ H01L 24/29 |
| 9,270,199 | B2* | 2/2016 | Kobayashi ............ H02M 7/003 |
| 9,490,200 | B2* | 11/2016 | Yoshihara ............ H01L 24/90 |
| 9,831,353 | B2* | 11/2017 | Kawata ............ H01L 27/0688 |
| 9,853,378 | B2* | 12/2017 | Kim ................ H01R 12/7088 |
| 10,109,426 | B2* | 10/2018 | Yang ...................... H01G 4/224 |
| 2006/0108684 | A1 | 5/2006 | Stevanovic et al. |
| 2007/0134976 | A1* | 6/2007 | Fujimoto ............ H01L 25/072 |
| | | | 439/495 |
| 2008/0087994 | A1* | 4/2008 | Yokomae ................ H01L 24/33 |
| | | | 257/E23.031 |
| 2008/0100993 | A1* | 5/2008 | Muller ................ H05K 7/1432 |
| | | | 361/624 |
| 2010/0148298 | A1* | 6/2010 | Takano ................ H01L 24/40 |
| | | | 257/500 |
| 2013/0119908 | A1* | 5/2013 | Harada ............ B62D 5/0406 |
| | | | 318/400.42 |
| 2013/0235636 | A1* | 9/2013 | Kadoguchi ........... H02M 7/537 |
| | | | 363/131 |
| 2013/0294032 | A1* | 11/2013 | Stella ................ H01L 23/367 |
| | | | 361/702 |
| 2014/0197525 | A1* | 7/2014 | Kadoguchi ....... H01L 23/49562 |
| | | | 257/666 |
| 2014/0361424 | A1* | 12/2014 | Horio ................ H01L 23/043 |
| | | | 257/704 |
| 2015/0092375 | A1* | 4/2015 | Otremba ................ H01L 24/36 |
| | | | 361/767 |
| 2015/0194362 | A1* | 7/2015 | Otremba ................ H01L 24/18 |
| | | | 257/676 |
| 2016/0336252 | A1* | 11/2016 | Houzouji ................ H01L 23/24 |
| 2017/0110341 | A1* | 4/2017 | Onoda .................... H01L 24/33 |
| 2017/0148770 | A1* | 5/2017 | Ishino ................ H01L 23/3121 |
| 2017/0155341 | A1* | 6/2017 | Nomura ................ H01L 25/18 |
| 2017/0301633 | A1* | 10/2017 | Kobayashi .......... H01L 23/3142 |
| 2017/0317006 | A1* | 11/2017 | Okumura ................ H01L 24/73 |
| 2017/0352629 | A1* | 12/2017 | Fukumoto ............ H01L 24/32 |

FOREIGN PATENT DOCUMENTS

| | | |
|---|---|---|
| CN | 204130523 | 1/2015 |
| JP | 11-163045 | 6/1999 |
| JP | 2006-148098 | 6/2006 |
| JP | 2009-005512 | 1/2009 |
| JP | 2013-017335 | 1/2013 |
| JP | 2013-135538 | 7/2013 |

OTHER PUBLICATIONS

Analysis of innovation trends in packaging for power modules, Yole Developpement, 2012, 33 pages.

* cited by examiner

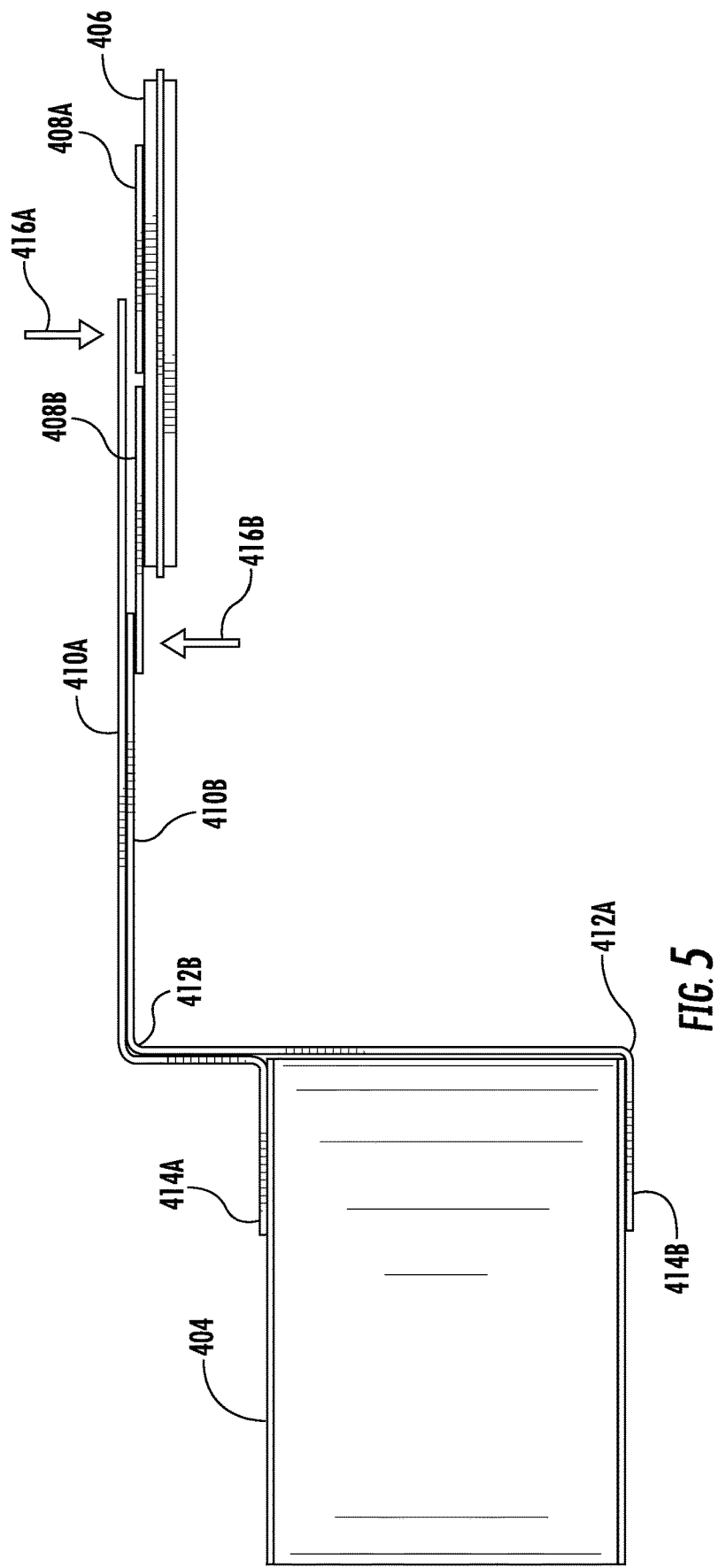

SEMICONDUCTOR DEVICE WITH STACKED TERMINALS

BACKGROUND

Many traditional semiconductor devices have essentially similar shapes: a housing with thin leads extending from it. The housing can be in form of a solid rectangle that serves to enclose and protect the circuitry on the inside. Protruding through the housing are the leads which are used to electrically connect the device to other components or circuits. For example, this form factor is used for some types of insulated-gate bipolar transistor (IGBT).

Because semiconductor devices are used for controlling electric current, their efficiency in doing so play an important role in the efficiency of the overall apparatus where they are being used. For instance, the performance and efficiency of a power inverter—a converter of direct current (DC) to alternating current (AC)—depends on the efficiency of the semiconductors devices in its circuits. The efficiency of the apparatus, in turn, can affect the performance of some larger system. For example, in an electric vehicle (e.g., a plug-in electric vehicle or a hybrid vehicle) the range of travel by electric power before one has to recharge the battery is an important characteristic. Therefore, an improved semiconductor device can improve the performance and efficiency of electric vehicles and other systems.

SUMMARY

In a first aspect, a semiconductor device includes: a housing; a substrate inside the housing; first and second semiconductor circuits on the substrate; and first and second planar terminals electrically connected to the first and second semiconductor circuits, respectively, the first and second planar terminals stacked on top of each other, wherein each of the first and second planar terminals extends away from the housing.

Implementations can include any or all of the following features. The first and second semiconductor circuits are positioned in a common plane on top of the substrate, wherein the first planar terminal abuts the first semiconductor circuit, wherein the second planar terminal is positioned on an opposite side of the first planar terminal from the first and second semiconductor circuits, wherein the second planar terminal contains a contact portion offset from a main portion thereof by an offsetting portion, and wherein the contact portion abuts the second semiconductor circuit. The housing has a common opening through which the first and second planar terminals extend away from the housing. The semiconductor device further comprises an electrical insulation layer between the first planar terminal and at least the main portion of the second planar terminal. The first and second semiconductor circuits are positioned in a common plane on top of the substrate, and the semiconductor device further comprises: a first busbar abutting the first semiconductor circuit, wherein the first planar terminal abuts the first busbar; and a second busbar abutting the second semiconductor circuit, wherein the second planar terminal abuts the second busbar. The first busbar is planar and extends out through the housing, and wherein the first planar terminal abuts the first busbar outside the housing. The second busbar is planar and has a portion thereof exposed through an opening in the housing. The second planar terminal is positioned on an opposite side of the first planar terminal from the first and second busbars, wherein the second planar terminal contains a contact portion offset from a main portion thereof by an offsetting portion, and wherein the contact portion abuts the portion of the second busbar. The first and second planar terminals overlap each other for most of their respective surface areas. Each of the first and second planar terminals has a width that is at least 70% of a width of the semiconductor device.

In a second aspect, an apparatus includes: a plurality of semiconductor devices each comprising a substrate, first and second semiconductor circuits on the substrate, and first and second busbars abutting the first and second semiconductor circuits, respectively; a capacitor; and first and second planar terminals electrically connected to the capacitor, the first and second planar terminals stacked on top of each other, wherein the first planar terminal abuts the first busbar of each of the plurality of semiconductor devices, and wherein the second planar terminal abuts the second busbar of each of the plurality of semiconductor devices.

Implementations can include any or all of the following features. The apparatus further comprises a plurality of capacitors, wherein the first and second planar terminals are electrically connected to each of the plurality of capacitors. Each of the first and second planar terminals comprises a respective sheet that extends between the capacitor and the plurality of semiconductor devices. At least one of the sheets has a step shape to provide a first contact plane on a far side of the capacitor. The other of the sheets also has a step shape to provide a second contact plane on a near side of the capacitor.

In a third aspect, a method includes: positioning semiconductor devices in a row, each of the semiconductor devices comprising a substrate, first and second semiconductor circuits on the substrate, and first and second busbars abutting the first and second semiconductor circuits, respectively; forming an assembly by placing a first planar terminal in contact with the first busbar of each of the plurality of semiconductor devices, and a second planar terminal in contact with the second busbar of each of the plurality of semiconductor devices, the first and second planar terminals stacked on top of each other; welding the first planar terminal to the first busbar of each of the plurality of semiconductor devices, the welding performed from one side of the assembly; and welding the second planar terminal to the second busbar of each of the plurality of semiconductor devices, the welding performed from an opposite side of the assembly.

Implementations can include any or all of the following features. The method further comprises including an electrical insulation layer between the first and second planar terminals. The method further comprises electrically connecting each of the first and second planar terminals to a plurality of capacitors. The welding includes laser welding.

BRIEF DESCRIPTION OF DRAWINGS

FIG. 5 shows a cross section of the assembly in FIG. 4.

DETAILED DESCRIPTION

This document describes examples of systems and techniques relating to improved semiconductor devices. In some implementations, a semiconductor device has relatively large and planar high-voltage terminals that are stacked on top of each other. These planar terminals and their arrangement with regard to the device as a whole can allow more efficient semiconductor operation and provide a convenient manufacturing process. For example, some parts of systems that are traditionally arranged around the device can instead be integrated into the same package as the device. This can improve the device's electrical and thermal performance, reduce its inductance, and lower the manufacturing and assembly costs.

Some examples herein mention IGBTs or power inverters. This is for illustrative purposes only and other implementations include transistors other than an IGBT and/or an apparatus other than an inverter.

In a conventional IGBT, the module essentially consists of a substrate with four semiconductor circuits (also referred to as silicon dies) positioned in a generally rectangular arrangement on its surface. The module then has two busbars soldered to the silicon dies so that they extend away from the module. That is, each of the busbars is positioned on top of two of the silicon dies so that one busbar end is on the substrate and the other end extends beyond the edge of the substrate. These busbars are usually parallel to each other and spaced apart some distance that essentially corresponds to the positioning of the silicon dies on the substrate. In operation, current flows into the semiconductor device through one of the busbars, passes through the silicon dies, and flows out of the device through the other busbar.

One of the electrical characteristics that negatively affect semiconductor device performance is its inductance. It is therefore desirable to lower the inductance of a device without diminishing its ability to conduct and convert current. In the IGBT describe above, the inductance is proportional to the area between the busbars. Looking at the IGBT at a higher level, the individual silicon dies are connected to each other by bond wires that also connect them to one or more of the three leads extending from the housing. The bond wires often loop up in between two silicon dies, or between a die and the lead. In that context, the inductance is proportional to the area under the loop of the bond wire. As such, the efficiency of the semiconductor device can be improved by reducing the area between busbars or the area under bond wire loops.

Figure 1:
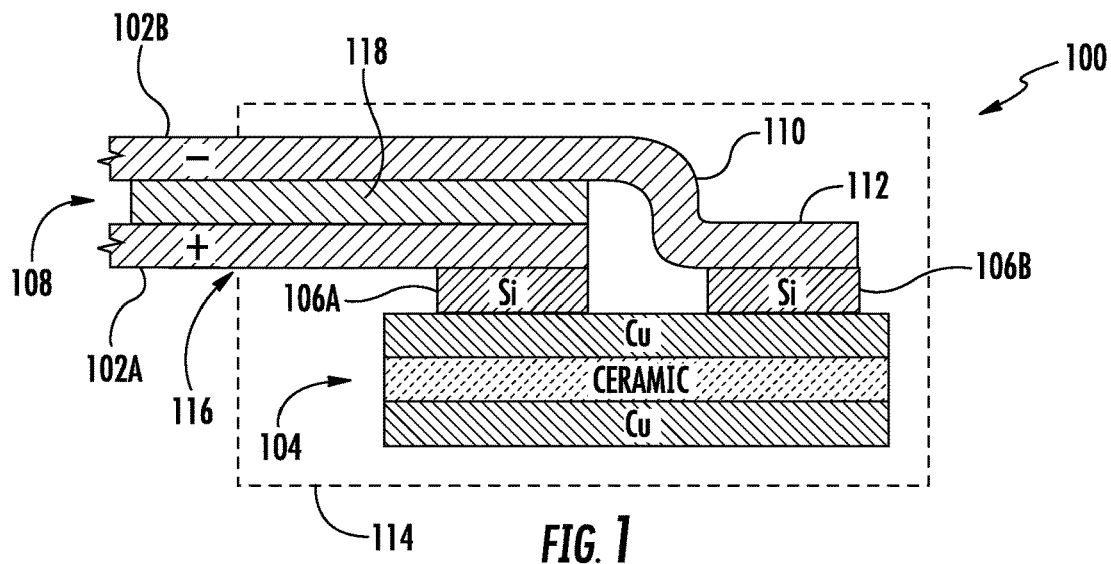
FIG. 1 shows a cross section of an example of a semiconductor device having stacked planar terminals.

FIG. 1 shows a cross section of an example of a semiconductor device 100 having stacked planar terminals 102A-B. The device is implemented using a substrate 104. The substrate can serve to direct heat away from the device while electrically insulating high-voltage components. In some implementations, the substrate includes a direct bonded copper (DBC) structure. For example, the DBC structure can include a ceramic layer sandwiched between copper layers as illustrated.

Semiconductor circuits are implemented on top of the substrate. Here, silicon dies 106A-B are shown. These silicon dies contain the circuitry that defines the particular mode(s) of operation of the overall semiconductor assembly. In some implementations, the silicon dies define an IGBT device. For example, the silicon dies can be manufactured as chips (sometimes referred to as silicon chips) that are then mounted onto the top surface of the substrate.

In this example, the semiconductor device has the stacked planar terminals 102A-B that abut the silicon dies 106A-B, respectively. The stacked planar terminals have an arbitrary length extending toward the left in the figure. Each of the terminals forms a complete plane, can be made of any conductive material, and can be soldered to its respective silicon die(s). The planar terminal 102A here abuts the silicon die 106A and is labeled positive (+) for reference. The planar terminal 102B here abuts the silicon die 106B and is labeled negative (−) for reference. That is, the terminals are stacked on top of each other and in this example the negative terminal overlaps the positive one. A separation 108 is here formed between the planar terminals.

Particularly, because the silicon dies 106A-B are in a common plane (on top of the substrate) the planar terminal 102B has an offsetting portion 110 along the entire width of the plane so as to provide a contact portion 112 that abuts the silicon die 106B. In some implementations, the contact portion forms a plane that is parallel to, and offset from, the plane of the main portion of the planar terminal 102B. The offsetting portion can be formed using any suitable technique, such as by stamping or bending.

A housing 114 encloses at least part of the semiconductor device. The housing can have one or more openings. In some implementations, the housing has a common opening 116 through which the planar terminals 102A-B extend. For example, after the substrate, the silicon dies and the planar terminals are assembled, the housing can be overmolded on that assembly so that the terminals extend from the enclosed structure.

An electric insulator 118 can be provided in the separation between the planar terminals. The insulator provides electric insulation across the entire width of the conductive sheets that form the respective planar terminals. In some implementations insulating paper is used.

That is, the above describes an example of a semiconductor device 100 that includes a housing 114, a substrate 104 inside the housing, semiconductor circuits 106A-B on the substrate, and planar terminals 102A-B that extend away from the housing and are electrically connected to the first and second semiconductor circuits, respectively. In particular, the planar terminals are stacked on top of each other.

As a result, the inductance is now proportional to the area between the planar terminals 102A-B plus the area between the terminal 102B and the substrate 104 where the negative terminal overlaps the positive one. This can allow for a significant reduction of inductance compared to traditional device designs. For example, because the planar terminals abut the silicon dies and also extend outside the housing, the busbar structure can be considered (at least partially) integrated within the housing. Some of the present implementations can avoid attaching IGBT leads to an external busbar layer and thereby eliminate the need to form holes in such busbar layer, which could otherwise increase the inductance.

Figure 2:
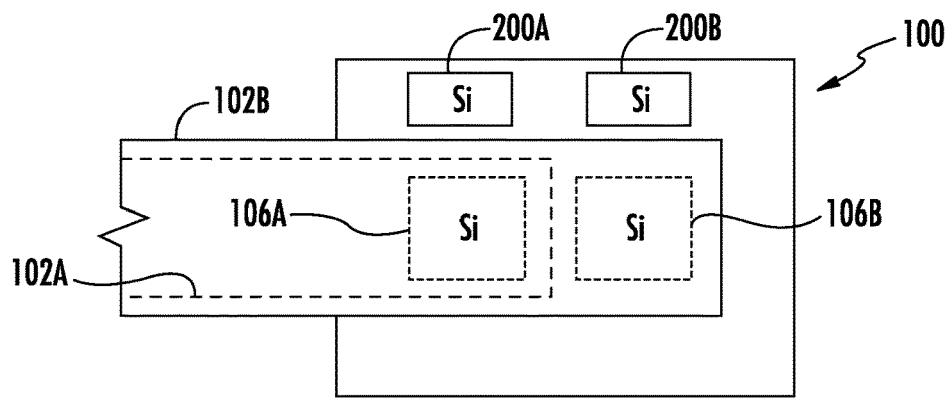
FIG. 2 shows a top view of the semiconductor device in FIG. 1.

FIG. 2 shows a top view of the semiconductor device 100 in FIG. 1. This illustrates how the planar terminal 102A abuts the silicon die 106A and the planar terminal 102B abuts the silicon die 106B. Because the planar terminals are stacked on top of each other and one of them partially overlaps the other, the terminal 102A and the dies 106A-B are shown in phantom. The terminal 102A is here shown as narrower that the terminal 102B only to clarify the illustration. This arrangement provides an increased busbar width per die area which improves performance. In some implementations, the planar terminals overlap each other for most of their respective surface areas. Also shown are additional semiconductor circuits. In some implementations, these include further silicon dies 200A-B that are also part of the semiconductor device. The planar terminals are attached to the respective silicon die(s) 106A-B and 200A-B by any suitable technique, including, but not limited to, soldering.

Figure 3:
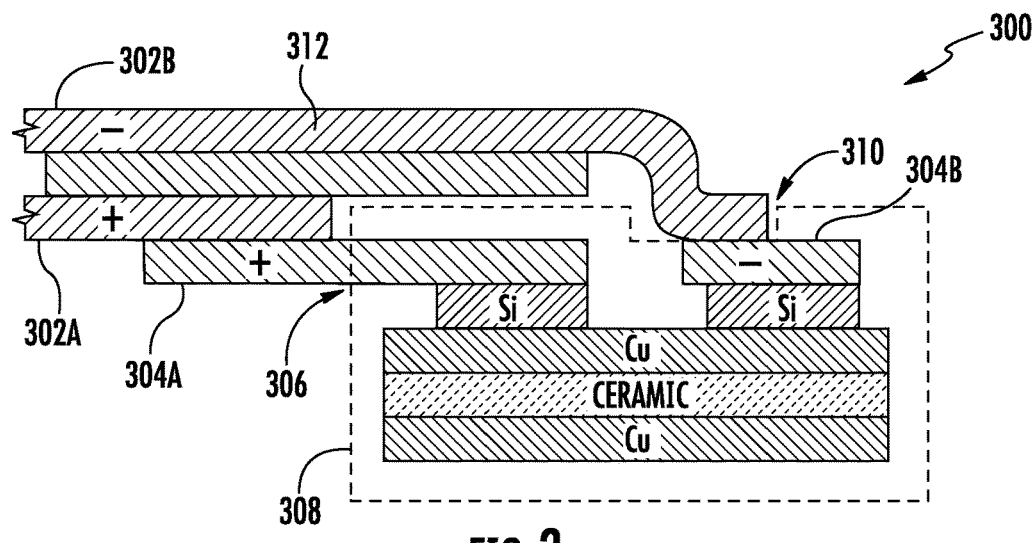
FIG. 3 shows a cross section of another example of a semiconductor device having stacked planar terminals.

FIG. 3 shows a cross section of another example of a semiconductor device 300 having stacked planar terminals 302A-B. The silicon dies and the substrate can be essentially the same as above. However, busbars 304A-B that abut the respective silicon dies here extend in a common plane, not stacked on top of each other. The busbars 304A-B can be essentially planar conductors that provide high voltage connection to the silicon dies. Some or all of the busbar 304A is exposed to the outside through an opening 306 in a housing 308 that encloses at least part of the semiconductor device. Also, some or all of the busbar 304B is exposed to the outside through an opening 310 in the housing. For example, the openings can be formed as part of an overmolding process that encapsulates the device into an enclosed structure.

Here, the planar terminal 302A abuts the busbar 304A outside the housing. Also, the planar terminal 302B abuts the busbar 304B, at least the part thereof that is exposed through the opening 310. For example, the planar terminal and the busbar can be welded together. In some implementations, this approach can lead to a simplified manufacturing process in that the planar terminals—which can be sheets wide enough to span several IGBTs—can easily be aligned with and attached to the busbars of the device(s). In some implementations, both of the busbars can be exposed through holes in a similar way as shown for the busbar 304B.

Similar to the previous example, the planar terminal 302B can have an offsetting portion that provides a contact portion—parallel with and offset from the main portion of the planar terminal—so as to reach at least a portion of its busbar.

Electric insulation 312 can be provided in the separation between the planar terminals 302A-B. In some implementations, the stacked structure of these planar terminals (with insulation) can be assembled in advance and then this assembly can be brought to the rest of the semiconductor device for making the electrical connections. As such, the current example can be considered as having the stacking done outside the semiconductor package instead of inside it which can simplify the manufacture.

Figure 4:
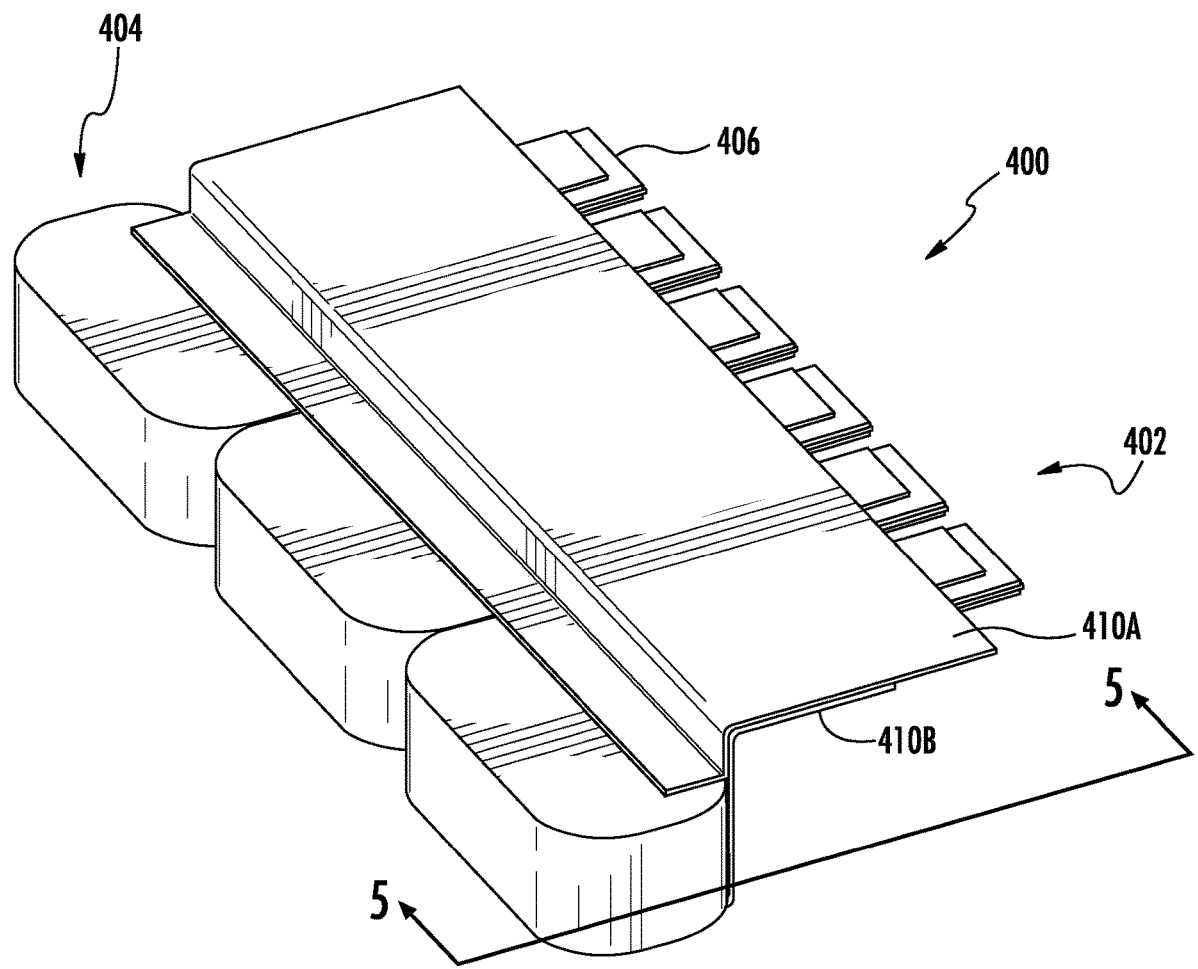
FIG. 4 shows a perspective view of an assembly of semiconductor devices and capacitors.

FIG. 4 shows a perspective view of an assembly 400 of semiconductor devices 402 and capacitors 404. FIG. 5 shows a cross section of the assembly in FIG. 4. In some implementations, capacitors are coupled to the semiconductor devices in order to protect against transients, and to help maintain a voltage on a DC bus. For example, the capacitors can serve as DC link capacitors. Any form of capacitor conductors can be used, including, but not limited to, films or foils (e.g., folded or rolled into a compact structure).

Here, a set of six semiconductor devices 402 are shown but in other implementations more or fewer can be used. The semiconductor housings are here omitted for clarity. The semiconductor devices are arranged next to each other in a row. Each device has a substrate 406 and busbars 408A-B. The busbars are connected to respective semiconductor circuits on the substrates (e.g., silicon dies) which are not visible in this illustration. In particular, the silicon dies would be positioned between the respective busbars 408A-B and the substrate 406.

Planar terminals 410A-B are here comprised of conductive sheets that connect the capacitors 404 to each of the semiconductor devices via the busbars. The planar terminals are stacked on top of each other so that the planar terminal 410A abuts the busbar 408A and the planar terminal 410B abuts the busbar 408B. At the other end of the planar terminals, they connect to respective conductors of the capacitors. That is, each planar terminal connects multiple semiconductor devices to each of the several capacitors. FIG. 4 also illustrates that the busbars can have a significant width compared to the semiconductor device as a whole (essentially the substrate width). For example, each of the busbars can be at least 70% of the width of the semiconductor device.

One or more of the planar terminals 410A-B can have a step shape when viewed in profile. Here, the planar terminals are essentially flat planes in the area near the semiconductor devices. To accommodate the relative position of the capacitors and the semiconductor devices, the planar terminal 410B (the "lower" of the terminals in this example) makes turns 412A-B so as to provide a contact plane 414B for (in this example) the bottom conductor of the capacitor. The planar terminal 410A can make corresponding turns to form a contact plane 414A for the opposite capacitor conductor.

The planar terminals provide a continuous conductive plane for current traveling to and from the capacitors. That is, because there are no holes in these sheets or pins at their edge where they electrically connect to the semiconductor devices, there are fewer or no "necks" that impede the flow of current.

The assembly 400 can form part of a power inverter. In some implementations, the inverter can include two (or more) of the assembly 400 where the semiconductor devices (e.g., IGBTs) are jointly controlled so as to perform the DC-to-AC conversion. For example, two such assemblies can be oriented so that their respective semiconductor devices are near each other, which can simplify the placement and operation of cooling systems (e.g., liquid-based heatsinks).

An example of assembling an apparatus will now be described. This description will refer to some examples of components mentioned above for illustrative purposes. However, other components can be used instead of or in addition to these.

Semiconductor devices (e.g., 402) are positioned in a row. Each of the semiconductor devices comprises a substrate (e.g., 406), first and second semiconductor circuits (e.g., 106A-B) on the substrate, and first and second busbars (e.g., 408A-B) abutting the first and second semiconductor circuits, respectively.

An assembly is formed by placing a first planar terminal (e.g., 410A) in contact with the first busbar (e.g., 408A) of each of the plurality of semiconductor devices, and a second planar terminal (e.g., 410B) in contact with the second busbar (e.g., 408B) of each of the plurality of semiconductor devices. The first and second planar terminals are stacked on top of each other. For example, the terminals can first be stacked and then (as an assembled stack) be placed in contact with the respective busbars.

The first planar terminal is welded to the first busbar of each of the plurality of semiconductor devices. Such welding can be performed from one side of the assembly. A weld 416A from above the assembly is here schematically illustrated. Similarly, the second planar terminal is welded to the second busbar of each of the plurality of semiconductor devices. Such welding can be performed from the opposite side of the assembly. A weld 416B from below the assembly is here schematically illustrated. For example, laser welding can be used.

An electrical insulation layer (e.g., 118) can be included between the first and second planar terminals. For example, an insulating paper can be inserted before the terminals are stacked on top of each other.

Each of the first and second planar terminals can be electrically connected to a plurality of capacitors (e.g., 404).

For example, respective contact planes of the terminals can be connected (e.g., welded) to respective capacitor terminals.

More or fewer steps can be performed in some assembly processes. Also, two or more steps can be performed in a different order.

A number of implementations have been described as examples. Nevertheless, other implementations are covered by the following claims.

What is claimed is:

1. A semiconductor device comprising:
    a housing;
    a substrate inside the housing;
    a first semiconductor circuit disposed on the substrate;
    a second semiconductor circuit disposed on the substrate, wherein the first semiconductor circuit and the second semiconductor circuit each have a top side and a bottom side;
    a first planar terminal comprising:
    a first portion of the first planar terminal electrically connected to the top side of the first semiconductor circuit, and a second portion of the first planar terminal extending away from the housing, the first portion of the first planar terminal and the second portion of the first planar terminal being part of a single piece conductive sheet; and
    a second planar terminal comprising:
    a first portion of the second planar terminal electrically connected to the top side of the second semiconductor circuit, a second portion of the second planar terminal extending away from the housing, and a third step shaped portion of the second planar terminal positioned between the first portion of the second planar terminal and the second portion of the second planar terminal, wherein at least the second portion of the first planar terminal and at least the second portion of the second planar terminal are stacked in a direction that is normal to the substrate such that the second planar terminal overlays on top of the first planar terminal inside the housing, and wherein the second portion of the first planar terminal and the first portion of the second planar terminal are coplanar.

2. The semiconductor device of claim 1, wherein the first semiconductor circuit and the second semiconductor circuit are positioned in a common plane on top of the substrate, wherein the first portion of the first planar terminal abuts the first semiconductor circuit, and wherein the first portion of the second planar terminal is parallel to and offset from the second portion of the second planar terminal thereof by the third step shaped portion of the second planar terminal, and wherein the first portion of the second planar terminal abuts the second semiconductor circuit.

3. The semiconductor device of claim 2, wherein the housing has a common opening through which the second portion of the first planar terminal and the second portion of the second planar terminal extend away from the housing in a stacked configuration.

4. The semiconductor device of claim 2, further comprising an electrical insulation layer disposed between the first planar terminal and the second planar terminal.

5. The semiconductor device of claim 1, wherein the first and second semiconductor circuits are positioned in a common plane on top of the substrate, the semiconductor device further comprising:
    a first busbar abutting the first semiconductor circuit, wherein the first planar terminal abuts the first busbar; and
    a second busbar abutting the second semiconductor circuit, wherein the second planar terminal abuts the second busbar.

6. The semiconductor device of claim 5, wherein the first busbar is planar and extends out through the housing, and wherein the first planar terminal abuts the first busbar outside the housing.

7. The semiconductor device of claim 5, wherein the second busbar is planar and has a portion thereof exposed through an opening in the housing.

8. The semiconductor device of claim 7, wherein the second planar terminal is positioned on an opposite side of the first planar terminal from the first and second busbars, wherein the second planar terminal contains a contact portion offset from a main portion thereof by an offsetting portion, and wherein the contact portion abuts the portion of the second busbar.

9. The semiconductor device of claim 1, wherein the first planar terminal and the second planar terminal are overlaying for most of their respective surface areas.

10. The semiconductor device of claim 1, wherein the first planar terminal and the second planar terminal has a width that is at least 70% of a width of the semiconductor device.

11. The semiconductor device of claim 1, wherein the first planar terminal is a positive terminal, and wherein the second planar terminal is a negative terminal.

12. The semiconductor device of claim 1, wherein the first semiconductor circuit and the second semiconductor circuit comprise silicon.

13. The semiconductor device of claim 1, wherein the third step shaped portion is formed by stamping or bending.

14. The semiconductor device of claim 1, wherein the substrate comprises a ceramic layer and is configured to direct heat away from the semiconductor device and electrically insulate at least one or more high-voltage semiconductor circuits of the semiconductor device.

15. The semiconductor device of claim 1, wherein the first portion of the first planar terminal is directly electrically connected to the top side of the first semiconductor circuit, and wherein the first portion of the second planar terminal is directly electrically connected to the top side of the second semiconductor circuit.

16. The semiconductor device of claim 1, wherein the second portion of the first planar terminal and the second portion of the second planar terminal both extend away from the housing on the same side of the housing in a stacked configuration.

17. The semiconductor device of claim 1, wherein at least the second portion of the first planar terminal is situated on one horizontal plane and at least the second portion of the second planar terminal is situated on another horizontal plane.

18. The semiconductor device of claim 1, wherein the at least second portion of the second planar terminal overlays on top of the at least second portion of the first planar terminal with only an electrical insulation layer directly between the at least second portion of the first planar terminal and the at least second portion of the second planar terminal, and wherein the at least second portion of the second planar terminal and the at least second portion of the first planar terminal are uncovered with laminate material.

19. The semiconductor device of claim 1, wherein each of the first planar terminal and the second planar terminal is a single piece conductive sheet.

20. The semiconductor device of claim 1, further comprising an additional first semiconductor circuit and an additional second semiconductor circuit, wherein the first portion of the first planar terminal electrically connects to the topside of both first semiconductor circuits, wherein the first portion of the second planar terminal electrically connects to the topside of both second semiconductor circuits, and wherein at least the first portion of the first planar terminal is part of a single piece conductive sheet and at least the first portion of the second planar terminal is part of another single piece conductive sheet.

\* \* \* \* \*